US010763219B2

(12) United States Patent
Almiron et al.

(10) Patent No.: US 10,763,219 B2
(45) Date of Patent: Sep. 1, 2020

(54) SIGNAL CONDUCTOR ROUTING CONFIGURATIONS AND TECHNIQUES (71) Applicant: Allegro MicroSystems, LLC, Manchester, NH (US)

(72) Inventors: Cristian David Almiron, Buenos Aires (AR); Juan Jose Baudino, Buenos Aires (AR)

(73) Assignee: Allegro MicroSystems, LLC, Manchester, NH (US)

( * ) Notice: Subject to any disclaimer, the term of this patent is extended or adjusted under 35 U.S.C. 154(b) by 9 days.

(21) Appl. No.: 16/102,984

(22) Filed: Aug. 14, 2018

(65) Prior Publication Data
US 2020/0058597 A1    Feb. 20, 2020

(51) Int. Cl.
H01L 23/552    (2006.01)
H01L 23/522    (2006.01)
H01L 23/528    (2006.01)

(52) U.S. Cl.
CPC .......... H01L 23/552 (2013.01); H01L 23/528 (2013.01); H01L 23/5226 (2013.01); H01L 23/5227 (2013.01)

(58) Field of Classification Search
CPC ............... H01L 23/552; H01L 23/5226; H01L 23/5227; H01L 23/528
See application file for complete search history.

(56) References Cited

U.S. PATENT DOCUMENTS 7,705,586 B2   4/2010   Van Zon et al.
8,339,134 B2   12/2012  Chen et al.
8,907,669 B2   12/2014  Petrie
2002/0072230 A1*  6/2002  Li ................. H01L 21/76814
                                                   438/677
2017/0018504 A1*  1/2017  Byun ................ H01L 23/5286

FOREIGN PATENT DOCUMENTS

EP    1797496    7/2009

OTHER PUBLICATIONS

Chung "Materials for Electromagnetic Interference Shielding", ASM International, Oct. 25, 1999, 5 pages.
Keshtkar et al. "Magnetic Shield Effectiveness in Low Frequency", International Journal of Computer and Electrical Engineering, vol. 3, No. 4, Aug. 2011, 7 pages.
Weibler "Properties of Metals Used for RF Shielding" Reprinted from EMC Test & Design, Dec. 1993, 6 pages.

* cited by examiner

Primary Examiner — Fernando L Toledo
Assistant Examiner — Valerie N Newton
(74) Attorney, Agent, or Firm — Daly, Crowley, Mofford & Durkee, LLP (57) ABSTRACT A substrate includes at least first, second, and third metal layers and adjacent substrate portions having rotated arrangements of signal traces provided by the metal layers. Each metal layer includes first and second spaced portions. The first portion of the first metal layer includes a first trace configured to carry a first signal and the second portion of the first metal layer includes a second trace configured to carry a second signal. The first portion of the second metal layer includes third and fourth spaced traces configured to carry the second signal and the second portion includes fifth and sixth spaced traces configured to carry the first signal. The first portion of the third metal layer includes a seventh trace configured to carry the first signal and the second portion includes an eighth trace configured to carry the second signal.

19 Claims, 6 Drawing Sheets

SIGNAL CONDUCTOR ROUTING CONFIGURATIONS AND TECHNIQUES

CROSS REFERENCE

Not applicable.

STATEMENT REGARDING FEDERALLY SPONSORED RESEARCH

Not applicable.

FIELD

This disclosure relates generally to signal conductor routing configurations and techniques and, more particularly, to signal conductor routing configurations and techniques with immunity to magnetic induction.

BACKGROUND

Shielding sensitive signals from magnetic flux is often necessary to avoid unexpected behaviors in circuits. Typically, for relatively low-frequency magnetic fields, metal shielding structures can be used to prevent magnetic flux from adversely affecting circuits and signals within and between circuits. This is because the effectiveness of shielding (i.e., the skin effect or depth to which magnetic flux can penetrate) is based in part on frequency.

As the frequency of the magnetic flux increases, so does its depth of penetration into metal shielding structures. While the efficacy of metal shielding of high frequency fields can be improved by increasing the thickness of the shield structure, such increased shield thickness can be impractical and costly in terms of material and space.

Magnetic field sensors generally use one or more magnetic field sensing elements in combination with other circuitry to detect magnetic fields for various purposes, such as to detect movement of a target, angular position of a target, proximity of a target, or a current through a conductor. It will be appreciated that based on this sensing methodology, accurate detection of only intended magnetic fields and immunity to detection of stray and other unintended fields is critical to accurate operation of magnetic field sensors.

SUMMARY

According to the disclosure, a substrate includes a first, second, and third metal layer. The first metal layer has first and second spaced portion with the first portion including a first trace configured to carry a first signal and the second portion including a second trace configured to carry a second signal. The second metal layer is disposed above the first metal layer and has first and second spaced portions. The first portion of the second metal layer includes third and fourth spaced traces configured to carry the second signal and the second portion includes fifth and sixth spaced traces configured to carry the first signal. The third metal layer is disposed above the second metal layer and has first and second spaced portions. The first portion of the third metal layer includes a seventh trace configured to carry the first signal and the second portion includes an eighth trace configured to carry the second signal.

With this arrangement, immunity of the signals to magnetic fields is achieved. Because each signal is essentially "split" so as to be carried by multiple traces, which traces are effectively "rotated" in the portions of the metal layers along the length of the substrate, the effects of exposure of the traces carrying a particular signal to magnetic fields are effectively cancelled. In this way, the likelihood is reduced that magnetic fields will interfere with operation of circuitry associated with such signals.

Features may include one or more of the following individually or in combination with other features. The first trace, the third trace, the fourth trace, and the seventh trace can be spaced from a central longitudinal axis of the substrate. Also, the first trace, the third trace, the fourth trace, and the seventh trace can be spaced from the central longitudinal axis of the substrate by the same distance.

In embodiments, the first portion of the first metal layer also includes at least a portion of the second trace. The first portion of the second metal layer can also include a connecting trace coupled to the fifth and sixth traces and the first portion of the third metal layer can also include at least a portion of the eighth trace.

In embodiments, a first interconnect can be configured to couple the fifth and sixth traces to at least one of the first or seventh traces. Further, a second interconnect can be configured to couple the second trace to at least one of the third or fourth traces and a third interconnect can be configured to couple the eighth trace to at least one of the third or fourth traces. Also, the first, second, and third interconnects can include at least one conductive via.

In embodiments, a first interlayer can be disposed between the first metal layer and the second metal layer and a second interlayer can be disposed between the second metal layer and the third metal layer. The first and second interlayers can have a thickness of approximately 7700 Angstrom.

Further, a gap between the first and second portions of the first metal layer can be substantially vertically aligned with a gap between the first and second portions of the second metal layer and a gap between the first and second spaced portions of the third metal layer.

In embodiments, the first metal layer also has a third portion spaced from the second portion, with the third portion including a ninth trace configured to carry the second signal. The second metal layer can also have a third portion spaced from the second portion, with the third portion including tenth and eleventh traces configured to carry the first signal. The third metal layer can have a third portion spaced from the second portion, with the third portion including a twelfth trace configured to carry the second signal.

In embodiments, the first signal is generated by a first magnetic field sensing element and the second signal is generated by a second magnetic field sensing element.

Also described is a substrate for an integrated circuit having at least three metal layers disposed substantially parallel to one another. The substrate includes a first arrangement of signals where a first signal is provided to a first trace of a first metal layer and a second trace of a third metal layer disposed above the first metal layer, and a second signal is provided to third and fourth traces of a second metal layer disposed between the first and third metal layers. Also, the substrate has a second arrangement of signals, rotated with respect to the first arrangement, where the second signal provided to a fifth trace of the first metal layer and a sixth trace of the third metal layer and the first signal provided to seventh and eighth traces of the second metal layer.

Features may include one or more of the following individually or in combination with other features. The first trace, the second trace, the third trace, and the fourth trace can be spaced from a central longitudinal axis of the substrate. Further, the first trace, the second trace, the third trace, and the fourth trace can be spaced from the central longitudinal axis of the substrate by the same distance.

In embodiments, the substrate has a third arrangement of signals rotated with respect to the second arrangement, where the first signal provided to a ninth trance of the first metal layer and a tenth trace of the third metal layer and the second signal provided to eleventh and twelfth traces of the second metal layer.

The substrate can also include a first interconnect configured to couple the first trace to the seventh trace, a second interconnect configured to couple the second trace to the eighth trace, a third interconnect configured to couple the third trace to the sixth trace, and a fourth interconnect configured to couple the fourth trace to the fifth trace. Further, the first, second, third, and fourth interconnects may include at least one conductive via.

In embodiments, the first signal is generated by a first magnetic field sensing element and the second signal is generated by a second magnetic field sensing element.

According to a further aspect, a substrate for an integrated circuit includes means for providing a first signal to a first trace extending along a first length of a first metal layer and to a second trace extending along a first length of a third metal layer disposed above the first metal layer. Further the substrate may include means for providing a second signal to third and fourth traces extending along a first length of a second metal layer disposed between the first and third metal layers with the first length of the second metal layer being substantially vertically aligned with the first length of the first and third metal layers. The substrate can also include means for coupling the first trace and the second trace to fifth and sixth traces extending along a second length of the second metal layer and means for coupling the third trace to a seventh trace extending along a second length of the third metal layer. Further, the substrate may include means for coupling the fourth trace to an eighth trace extending along a second length of the first metal layer, with the second length of the first metal layer, the second length of the second metal layer and the second length of the third metal layer being substantially vertically aligned with each other.

The substrate may also include means for providing, at a third portion of the substrate spaced from the second portion, the first signal to a ninth trance of the first metal layer and a tenth trace of the third metal layer. Further, the substrate can also include means for providing, at the third portion, the second signal to eleventh and twelfth traces of the second metal layer.

BRIEF DESCRIPTION OF THE DRAWINGS

The concepts, structures, and techniques sought to be protected herein may be more fully understood from the following detailed description of the drawings, in which.

The drawings are not necessarily to scale, or inclusive of all elements of a system, emphasis instead generally being placed upon illustrating the concepts, structures, and techniques sought to be protected herein.

DETAILED DESCRIPTION

Before discussing the disclosure, some introductory concepts and terminology are provided. As used herein, the term "magnetic field sensing element" is used to describe a variety of electronic elements that can sense a magnetic field. The magnetic field sensing element can be, but is not limited to, a Hall effect element, a magnetoresistance element, or a magnetotransistor. As is known, there are different types of Hall effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As used herein, the term "magnetic field sensor" is used to describe a circuit that uses one or more magnetic field sensing elements, generally in combination with other circuits. The magnetic field sensor can be, for example, a rotation detector, a movement detector, a current sensor, or a proximity detector.

Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector (or movement detector) that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

As used herein, the term "processor" is used to describe an electronic circuit that performs a function, an operation, or a sequence of operations. The function, operation, or sequence of operations can be hard coded into the electronic circuit or soft coded by way of instructions held in a memory device. A "processor" can perform the function, operation, or sequence of operations using digital values or using analog signals. In some embodiments, the "processor" can be embodied in an application specific integrated circuit (ASIC), which can be an analog ASIC or a digital ASIC. In some embodiments, the "processor" can be embodied in a microprocessor with associated program memory. In some embodiments, the "processor" can be embodied in a discrete electronic circuit, which can be an analog or digital. As used herein, the term "module" is used to describe a "processor."

A processor can contain internal processors or internal modules that perform portions of the function, operation, or sequence of operations of the processor. Similarly, a module can contain internal processors or internal modules that perform portions of the function, operation, or sequence of operations of the module.

As used herein, the term "predetermined," when referring to a value or signal, is used to refer to a value or signal that is set, or fixed, in the factory at the time of manufacture, or by external means, e.g., programming, thereafter. As used herein, the term "determined," when referring to a value or signal, is used to refer to a value or signal that is identified by a circuit during operation, after manufacture.

Figure 1:
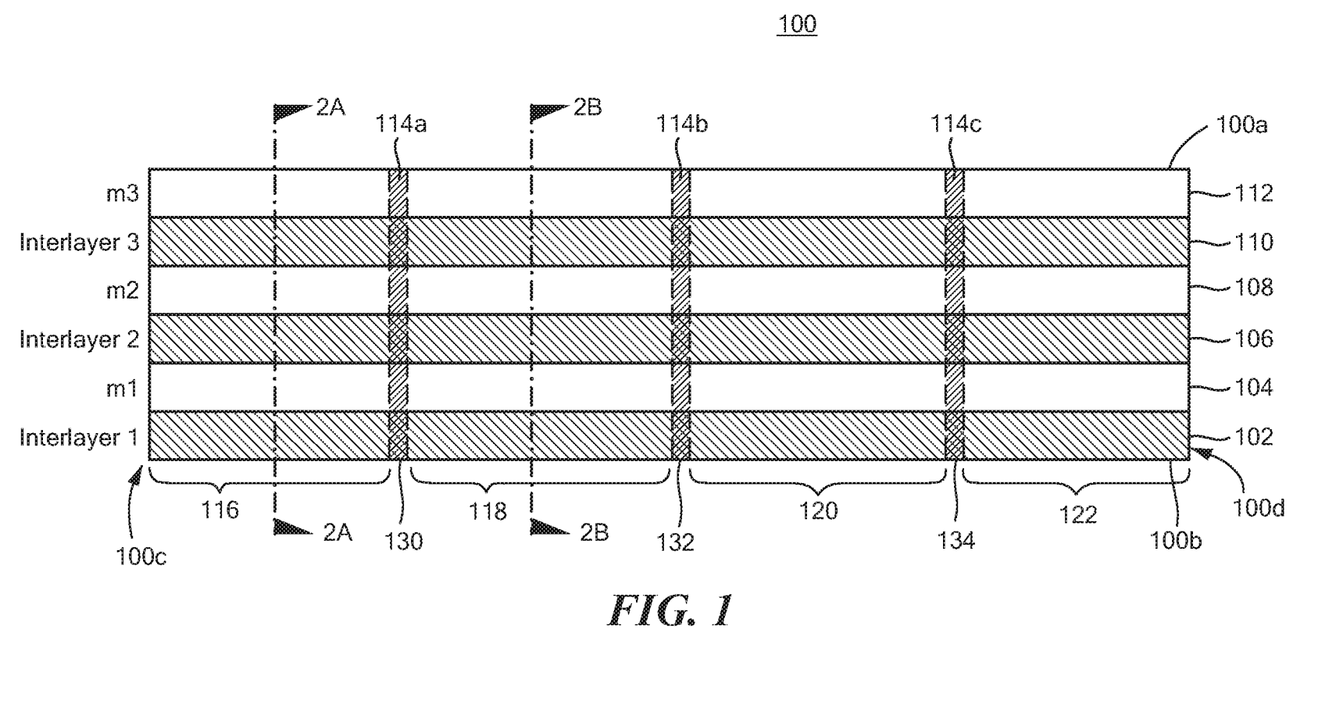
FIG. 1 is a cross-sectional side view of a substrate having at least two portions, according to some embodiments.

Referring to FIG. 1, a cross-sectional view of a substrate 100 is shown. Substrate 100 may form part of an integrated circuit ("IC") or other circuit requiring a substrate to support circuitry and requiring electrical signals to be routed from one location to another between circuitry and/or to and from pins, pads, leads or other connection types for connecting the circuitry to external circuits and systems. In embodiments, substrate 100 forms part of a sensor IC, such as a magnetic field sensor IC containing signals representative of a sensed magnetic field. Other types of sensor ICs utilizing substrate 100 include, but are not limited to temperature sensors, optical sensors, current sensors, and pressure sensors which may or may not include magnetic field sensing elements to name a few examples and some sensor ICs contain a combination of sensing types and methodologies.

Substrate 100 includes at least a first metal layer ("m1") 104, second metal layer ("m2") 108, and third metal layer ("m3") 112. According to some embodiments, the thickness of each metal layer may be approximately 0.650 µm (6250 Angstrom). In embodiments, each metal layer can include one or more metals and/or metal alloys having one or more thicknesses disposed above and/or below one another and arranged substantially vertically relative to one another. In other words, each metal layer can include one or more metals and/or metal alloys arranged in a "stack". The metal and/or metal alloys of each metal layer can include, but are not limited to, titanium, titanium alloys, aluminum, aluminum alloys (e.g. aluminum-copper alloys (AlCu) of various make-ups), copper, titanium nitride (TiN), or any combination thereof. As an example embodiment, a metal layer having a thickness of 6,250 Angstrom can include titanium having a thickness of 200 Angstrom, an aluminum-copper alloy having 5% copper and a thickness of 5,000 Angstrom, titanium having a thickness of 50 Angstrom, and titanium nitride having a thickness of 1,000 Angstrom. It will be appreciated that the thickness and other dimensions of the metal layers 104, 108, 112, as well as the materials and number of the metal layers can be varied to suit application requirements.

Each metal layer is disposed substantially parallel to the planes in which the opposing major surfaces 100a, 100b of substrate 100 lie and substantially parallel to one another. Surfaces 100a, 100b of substrate 100 may be referred to as top and bottom major surfaces and elements of substrate 100 may be referred to herein as being above and/or below other elements. It will be appreciated that the terms "top", "bottom", "above", and "below" are used herein to facilitate clarity of explanation and denote position relative to other elements, but do not require any particular orientation of the substrate in use, for example. According to some embodiments, the top surface 100a of substrate 100 may comprise a metal layer (such as m3 112 in the illustrative embodiment of FIG. 1).

According to some embodiments, an interlayer may be disposed between each metal layer. For example, in the illustrative embodiment of FIG. 1, interlayer 2 106 is disposed between metal layers m1 104 and m2 108 and interlayer 3 110 is disposed between metal layers m2 108 and m3 112. In some embodiments, the thickness of each interlayer is approximately 0.77 µm (7700 Angstrom). According to some embodiments, each metal layer may be disposed on a respective interlayer. In embodiments, each interlayer can comprise silicon dioxide ($SiO_2$).

The interlayers are disposed substantially parallel to each metal layer and substantially parallel to each other. According to some embodiments, an interlayer may be disposed below each metal layer (for example, in the illustrative embodiment of FIG. 1, interlayer 1 102 is disposed below metal layer m1 104, interlayer 2 106 is disposed below metal layer m2 108, and interlayer 3 is disposed below metal layer m3 112) while in other embodiments, an interlayer may be disposed above or both above and below each metal layer.

According to some embodiments, substrate 100 may include four or more metal layers disposed substantially parallel to the planes of major surfaces 100a, 100b of substrate 100 and substantially parallel to one another. In some embodiments, substrate 100 may include four or more interlayers disposed between, below, above—or any combination thereof—the four or more metal layers.

Each metal layer is configured to form one or more traces to carry one or more electrical signals. According to some embodiments, the traces of a metal layer may be formed through a subtractive process (i.e. removing metal from a metal layer until only the desired traces remain), an additive process (e.g. electroplating), a semi-additive process, or any combination thereof.

Substrate 100 includes two or more portions 116, 118, 120, 122. For example, in the example substrate of FIG. 1, substrate 100 has a first portion 116 and a second portion 118. According to some embodiments, the portions of substrate 100 may be equal in length and/or other characteristics with respect to each other, while in other embodiments they may differ. Each portion 116-122 of substrate 100 includes at least a portion of each metal layer and each interlayer. For example, in the illustrative embodiment of FIG. 1, portion 116 of substrate 100 includes at least a portion of interlayer 1 102, metal layer m1 104, interlayer 2 106, metal layer m2 108, interlayer 3 110, and metal layer m3 112.

The portions of metal layers and interlayers making up a portion 116-122 of substrate 100 are generally equal in length to the respective substrate portion. Thus, it will be appreciated that metal layers m1 104, m2 108, and m3 112 can be considered to likewise include respective portions, each of which extends along a respective length of substrate 100 like the respective substrate portion. Those of skill in the art will appreciate that substrate 100 and metal layers 104-112 may be divided into any number of portions along a length of substrate 100 from a first illustrated end 100c to a second illustrated end 100d and that the illustrated length may or may not represent the entire length of substrate 100.

According to some embodiments, a portion of substrate 100 may be between 5 to 7 micrometers in length. Likewise, the portions of metal layers and interlayers making up a portion of substrate 100 may generally be equal in length to the portion of substrate 100, for example each being between 5 to 7 micrometers in length. One of skill in the art will appreciate that the length of a portion of substrate 100, and likewise the lengths of the portions of the metal layers and interlayers, will depend upon factors such as the permissible capacitance and/or resistance associated with the signal traces of the metal layers.

In some embodiments, portions 116-122 of substrate 100 (and thus portions of the metal layers 104-108) may be spaced apart from each other by respective gaps 130, 132, 134, while in other embodiments they are substantially flush. According to some embodiments, the space, or gap, between adjacent portions of each metal layer may be substantially equal in distance. For example, the gap 130 between substrate portions 116, 118 may be substantially the same size as gap 132 between substrate portions 118, 120. Thus, it will be appreciated that a gap between the first and second portions of the first metal layer can be substantially vertically aligned with a gap between the first and second portions of the second metal layer and a gap between the first and second spaced portions of the third metal layer. Gaps 130, 132, 134 represent areas within which interconnections are made between traces of one substrate portion to traces of an adjacent substrate portion.

Substrate 100 further includes one or more interconnects 114a, 114b, 114c configured to electrically connect traces of one substrate portion to traces of another, adjacent substrate portion. In embodiments, such interconnects can take the form of one or more conductive via holes (also referred to herein as "conductive vias") configured to couple the traces of the metal layers to one another. Each conductive via 114a-114c extends from a metal layer through at least one interlayer to terminate at at least one other metal layer. For example, in the illustrative embodiment of FIG. 1, conductive via 114a can be configured to connect one or more traces of metal layer m1 104 within the first substrate portion 116 to one or more traces of metal layer m2 108 within the second substrate portion 118. According to some embodiments, conductive vias 114a-114c can extend straight through substrate 100 as shown (i.e., at an angle of 90 degrees relative to the major substrate surfaces 100a, 100b), while in other embodiments conductive vias 114a-114c can extend through the substrate an angle. Furthermore, while vias 114a-114c are shown to extend through the entirety of the height of the substrate from surface 100a to surface 100b, it will be appreciated that vias may extend through only a portion of the substrate as necessary to connect traces of two or more metal layers together.

Figure 2A:
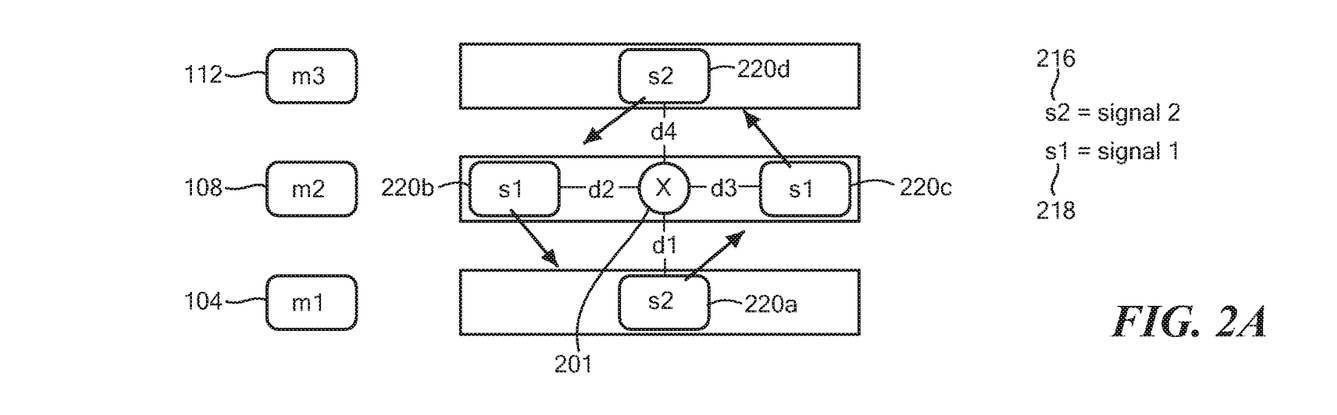
FIG. 2A is a cross-sectional view of a first portion of the substrate of FIG. 1 taken along line 2A-2A of FIG. 1.

Referring also to FIG. 2A, a cross-sectional view of FIG. 1 taken along line 2A-2A illustrates that in the first substrate portion 116, the first metal layer m1 104 contains a single trace 220a, the second metal layer m2 108 contains two traces 220b, 220c, and the third metal layer m3 112 contains a single trace 220d. The traces are labelled according to the electrical signal carried by the respective trace. Thus, the trace 220a in layer m1 104 carries a signal s2 216, the two traces 220b, 220c in layer m2 108 carry a signal s1 218, and the trace 220d in layer m3 112 carries the signal s2 118. A longitudinal axis that runs through the center of substrate 100 parallel to layers 104, 108, 112 is labeled 201.

The traces of each metal layer are spaced from the central longitudinal axis 201 by respective distances d1, d2, d3, and d4 as shown. In embodiments, traces carrying each signal s1, s2 are evenly spaced with respect to the central longitudinal axis 201. Thus, in the view of FIG. 2A, distances d1 and d4 are the substantially equal such that traces 220a, 220d are evenly spaced from axis 201 and, similarly, distances d2 and d3 are substantially equal such that traces 220b, 220c carrying signal s1 are evenly spaced from axis 201. Furthermore, all of the traces 220a-220d may be evenly spaced with respect to the central longitudinal axis 201 (i.e., distances d1, d2, d3, and d4 may be substantially equal).

Figure 2B:
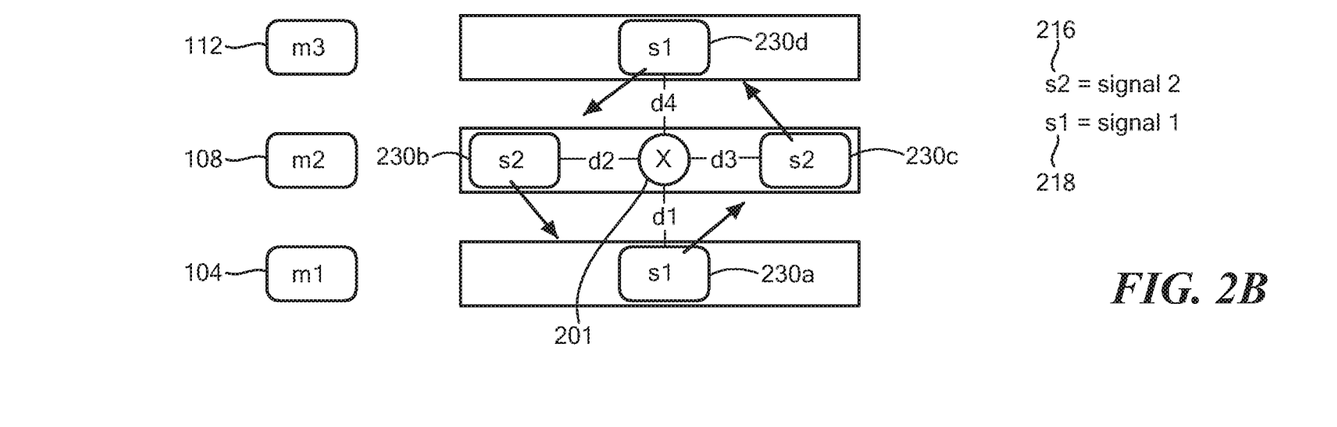
FIG. 2B is a cross-sectional view of a second portion of the substrate of FIG. 1 taken along line 2B-2B of FIG. 1.

Each portion of substrate 100 has a predetermined arrangement, or distribution, of the signals s1, s2 over the traces of the portion, with adjacent substrate portions generally having different arrangements of signals. Referring also to FIG. 2B, this cross-sectional view of substrate 100 taken along line 2B-2B of FIG. 1 illustrates that for substrate portion 118, the first metal layer m1 104 contains a single trace 230a carrying signal s1, the second metal layer m2 108 contains two traces 230b, 230c each carrying signal s2, and the third metal layer m3 112 contains a single trace 230d carrying signal s1.

In some embodiments, each portion of substrate 100 has a predetermined arrangement, or distribution, of four or more signals over the traces of the portion. According to some embodiments, each portion of substrate 100 having a predetermined arrangement of four or more signals may comprise respective portions of three or more metal layers, with each portion of a metal layer comprising the traces over which the four or more signals are distributed.

According to the disclosure, and as illustrated by FIGS. 2A and 2B, the arrangement of signals of adjacent portions 116-122 of substrate 100 are rotated, or twisted, relative to each other. In other words, the arrangement of signals in substrate portion 116 (as illustrated by FIG. 2A) is rotated relative to the arrangement of signals in adjacent substrate portion 118 (as illustrated by FIG. 2B). According to some embodiments, this rotation may be in a clockwise direction, while in other embodiments this rotation may be in a counterclockwise direction. Further, in some embodiments, the rotation may be between 0° and 180° or 0° and −180° according to the number of metal layers that substrate 100 includes. In the example of FIGS. 2A, 2B, this rotation of signals from one substrate portion 116 as shown in FIG. 2A to the next substrate portion 118 as shown in FIG. 2B is a counterclockwise rotation by 90°.

The rotating, or twisting, of the arrangement of signals from a first portion 116 to a second portion 118 of substrate 100 is achieved by coupling the traces of the first portion of substrate 100 to the traces of the second portion of substrate 100 with conductive vias 114a-114c. By rotating, or twisting the arrangement signals s1, s2 as the signals progress from one substrate portion to the next, along the length of the substrate, the signals s1, s2 are equally exposed to any magnetic fields to which substrate 100 is exposed. Because the signals are equally exposed, immunity of the signals to magnetic fields is improved as compared to non-rotated configurations.

The twisting arrangement of the signals may continue across every portion 116-122 of substrate 100. That is to say, the arrangement may be rotated, or twisted, relative to adjacent portions of substrate 100 for every portion 116-122 of substrate 100 along the entire length of the substrate from first end 100c to second end 100d. Thus, while FIGS. 2A and 2B demonstrate twisting over two portions of substrate 100, in other embodiments, the twisting may take place over three or more portions 116-122 of substrate 100. In general, it may be desirable to reduce the length of each portion of the substrate over which the twisting arrangement of signals continues, in order to maximize the number of twists across the substrate.

Figure 3A:
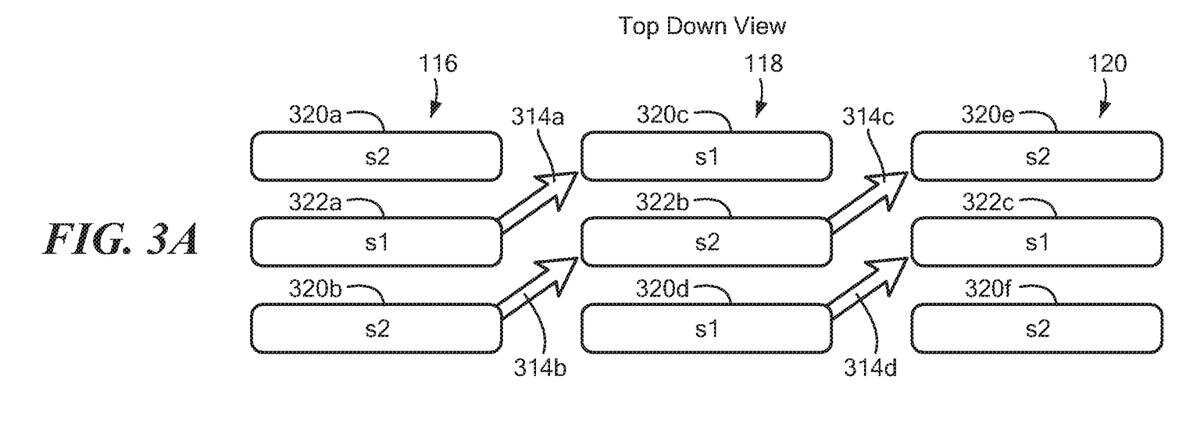
FIG. 3A is a top down view of the substrate of FIG. 1.
Figure 3B:
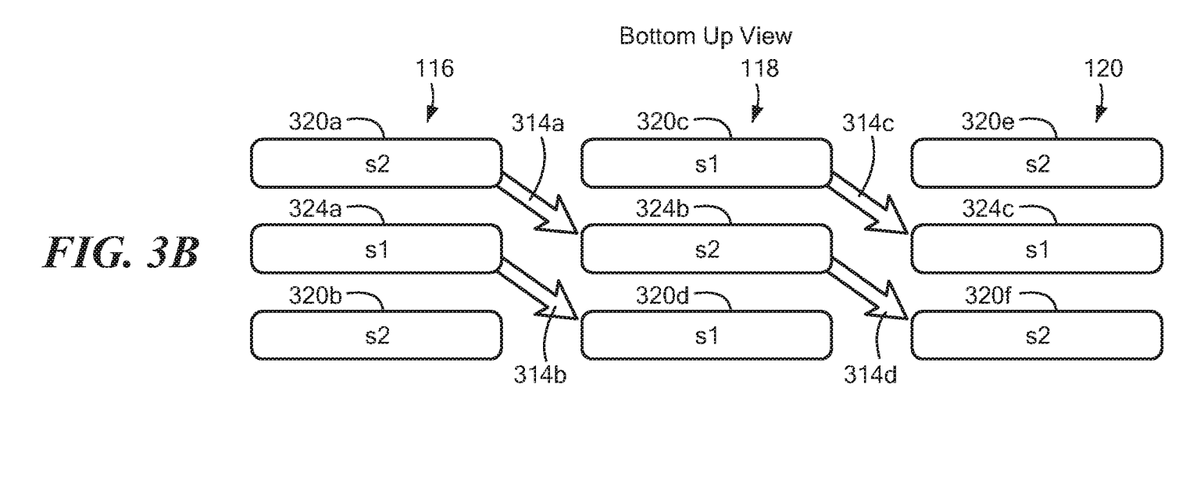
FIG. 3B is a bottom up view of the substrate of FIG. 1.

Referring also to FIGS. 3A and 3B, top and bottom views, respectively, of the substrate 100 of FIGS. 1, 2A, 2B (with the interlayers omitted from these views) further illustrate the twisting of signal trace arrangements over three portions 116, 118, 120 of substrate 100. For example, FIG. 3A shows a "top down" view of substrate portion 116 in the left-most column of the figure (i.e., a view from the top of FIG. 2A looking down at the substrate), a top down view of substrate portion 118 in the center column of the figure (i.e., a view from the top of FIG. 2B looking down at the substrate), and a top down view of substrate portion 120 in the right-most column of the figure. It should be appreciated that the top view of the substrate in FIG. 3A allows for the traces of the second metal layer m2 108 and the third metal layer m3 112 to be viewed.

From the top view of FIG. 3A, first portion 116 of substrate 100 includes a first arrangement of signals distributed over a first portion of second metal layer m2 108 and third metal layer m3 112. The first portion of the second metal layer m2 108 includes traces 320a and 320b, each configured to carry signal s2 216. Further, the first portion of the third metal layer m3 112 includes trace 322a configured to carry signal s1 218.

Also, from the top view of FIG. 3A, second portion 118 of substrate 100 includes a second arrangement of signals distributed over a second portion of the second metal layer m2 108 and a second portion of the third metal layer m3 112. The second arrangement of signals is rotated, or twisted, with respect to the first arrangement of signals. In the illustrative embodiment of FIG. 3A, the second arrangement of signals is rotated in a counterclockwise direction from the first arrangement of signals. For the second arrangement of signals, the second portion of the second metal layer m2 108 includes traces 320c and 320d, each configured to carry signal s1 218. Further, the second portion of the third metal layer m3 112 includes trace 322b configured to carry signal s2 216.

Further, from the top view of FIG. 3A, third portion 120 of substrate 100 includes a third arrangement of signals distributed over a third portion of the second metal layer m2 108 and a third portion of the third metal layer m3 112. The third arrangement of signals is rotated, or twisted, with respect to the second arrangement of signals. In the illustrative embodiment of FIG. 3A, the third arrangement of signals is rotated in a counterclockwise direction from the second arrangement of signals. For the third arrangement of signals, the third portion of the second metal layer m2 108 includes traces 320e and 320f, each configured to carry signal s2 216. Further, the third portion of the third metal layer m3 112 includes trace 322c configured to carry signal s1 218.

Referring now to FIG. 3B, a "bottom up" view of substrate portion 116 is shown in the left-most column of the figure (i.e., a view from the bottom of FIG. 2A looking up at the substrate), a bottom up view of substrate portion 118 is shown in the center column of the figure (i.e., a view from the bottom of FIG. 2B looking up at the substrate), and a bottom up view of substrate portion 120 is shown in the right-most column of the figure. It should be appreciated that the bottom up view of the substrate in FIG. 3B allows for the traces of the first metal layer m1 104 and the second metal layer m2 108 to be viewed.

From the bottom view of FIG. 3B, first portion 116 of substrate 100 includes a first arrangement of signals distributed over a first portion of the first metal layer 104 and the first portion of the second metal layer m2 108. The first portion of the first metal layer m1 104 includes trace 324a configured to carry signal s1 218. Further, the first portion of the second metal layer includes traces 320a and 320b, each configured to carry signal s2 216.

Also, from the bottom view of FIG. 3B, second portion 118 of substrate 100 includes a second arrangement signals distributed over a second portion of the first metal layer m1 104 and a second portion of the second metal layer m2 108. As discussed above with reference to FIG. 3A, the second arrangement of signals is rotated, or twisted, with respect to the first arrangement of signals. In the illustrative embodiment of FIG. 3B, the second arrangement of signals is rotated in a counterclockwise direction from the first arrangement of signals. For the second arrangement of signals, the second portion of the first metal layer m1 104 includes trace 324b configured to carry signal s2 216. Further, the second portion of the second metal layer m2 108 includes traces 320c and 320d, each configured to carry signal s1 218.

Further, from the bottom view of FIG. 3B, the third portion 120 of substrate 100 includes a third arrangement of signals distributed over a third portion of the first metal layer m1 104 and a third portion of the second metal layer m2 108. As discussed above with reference to FIG. 3A, the third arrangement of signals is rotated, or twisted, with respect to the second arrangement of signals. In the illustrative embodiment of FIG. 3B, the third arrangement of signals is rotated in a counterclockwise direction from the second arrangement of signals. For the third arrangement of signals, a third portion of the first metal layer m1 104 includes trace 324c configured to carry signal s1 218. Further, the third portion of the second metal layer m2 108 includes traces 320e and 320f, each configured to carry signal s2 216.

According to some embodiments, substrate 100 may include additional portions (i.e., four or more) each having an arrangement of signals distributed over the metal layers included in that portion of substrate 100. Each arrangement of signals is rotated relative to the arrangement of signals of an adjacent portion of substrate 100. For example, a third portion 120 of substrate 100 may have a third arrangement of signals and a fourth portion 122 of substrate 100 may have a fourth arrangement of signals. This fourth arrangement of signals is twisted, or rotated, with respect to the third arrangement of signals.

Figure 4A:
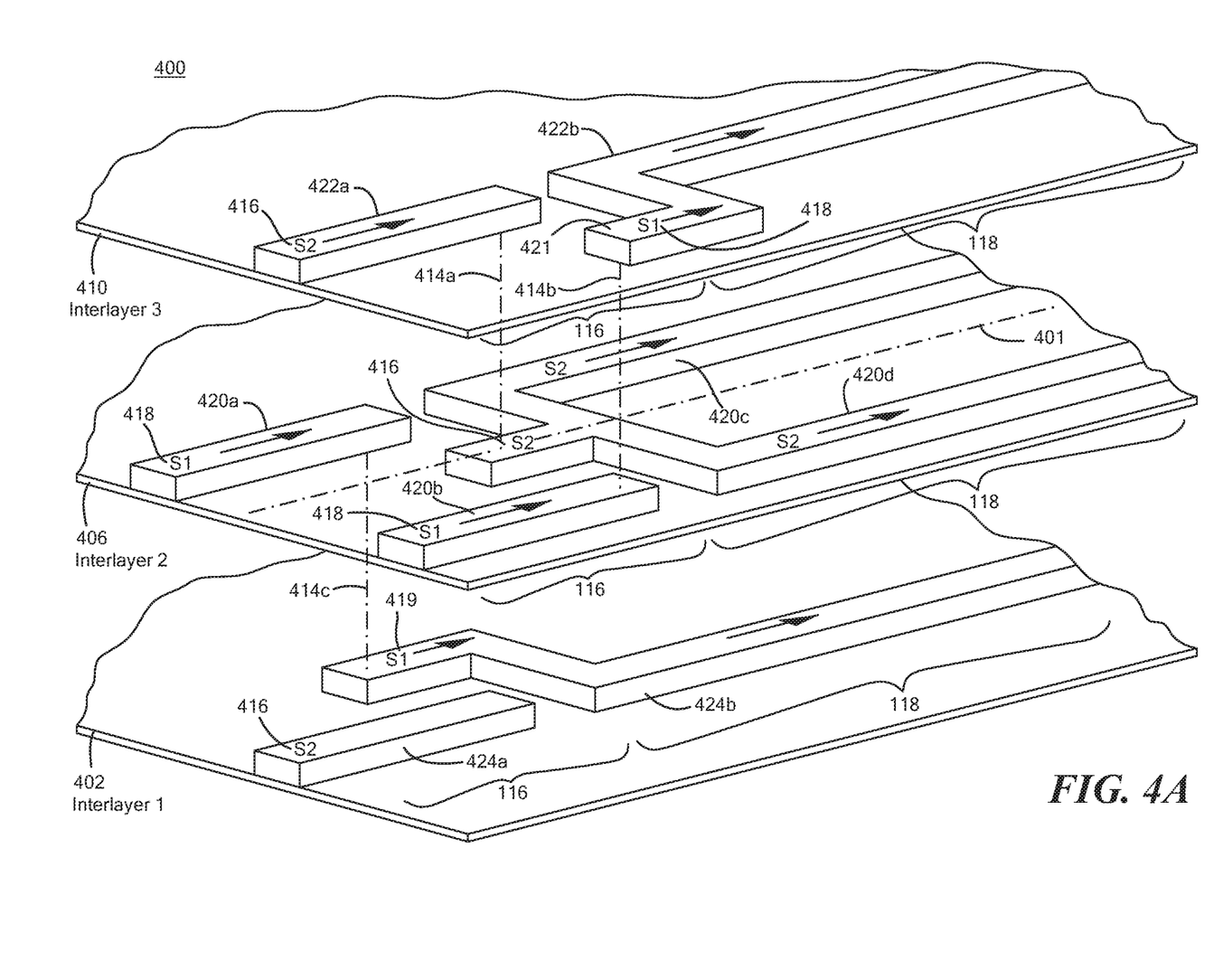
FIG. 4A is an exploded view of a substrate having two or more portions each with an arrangement of signals, according to some embodiments.

Referring also to FIG. 4A, an exploded view illustrates distribution of signal traces over portions 116 and 118 of substrate 100. More particularly, the first arrangement of signals of the first substrate portion 116 is rotated with respect to the second arrangement of signals of the second substrate portion 118.

The first substrate portion 116 includes trace 424a of a first metal layer (e.g., metal layer 104 of FIG. 1) disposed on an interlayer 1 402, traces 420a, 420b of a second metal layer (e.g., metal layer 108 of FIG. 1) disposed on interlayer 2 406, and trace 422a of a third metal layer (e.g., metal layer 112 of FIG. 1) disposed on interlayer 3 410. Traces 424a and 422a are configured to carry a second signal s2 416 and traces 420a, 420b are configured to carry a first signal s1 418, as labeled. Each of traces 424a, 420a, 420b, and 422a is substantially equally spaced with respect to a central longitudinal axis 401 as shown.

The second substrate portion 118 includes trace 424b of the first metal layer disposed on interlayer 402, traces 420c, 420d of the second metal layer disposed on interlayer 406, and trace 422b of the third metal layer disposed on interlayer 410. Traces 424b and 422b are configured to carry the first signal s1 418 and traces 420c, 420d are configured to carry the second signal s2 416, as labeled. Thus, the second substrate portion 118 includes a second arrangement of signals that is rotated with respect to the first arrangement of signals of the first substrate portion 116.

As discussed above, traces of a first portion 116 of substrate 100 are coupled to traces of a second portion 118 of substrate 100 by one or more conductive vias 114, in order to thereby rotate the first arrangement of signals of the first substrate portion 116 relative to the second arrangement of signals of the second substrate portion. To this end, traces from one substrate portion 116 may extend above or below traces of an adjacent substrate portion 118 to allow a conductive via to couple the traces together. Stated differently, traces from one substrate portion may overlap traces of an adjacent substrate portion. For example, a jogged portion 419 of trace 424b is disposed under trace 420a to allow a conductive via 414c to couple the traces together. Trace 422a is disposed over a forked interconnecting portion 416 of traces 420c, 420d to allow a conductive via 414a to couple the traces together. And a jogged portion 421 of trace 422b is disposed over trace 420b to allow conductive via 414b to couple the traces together.

Figure 4B:
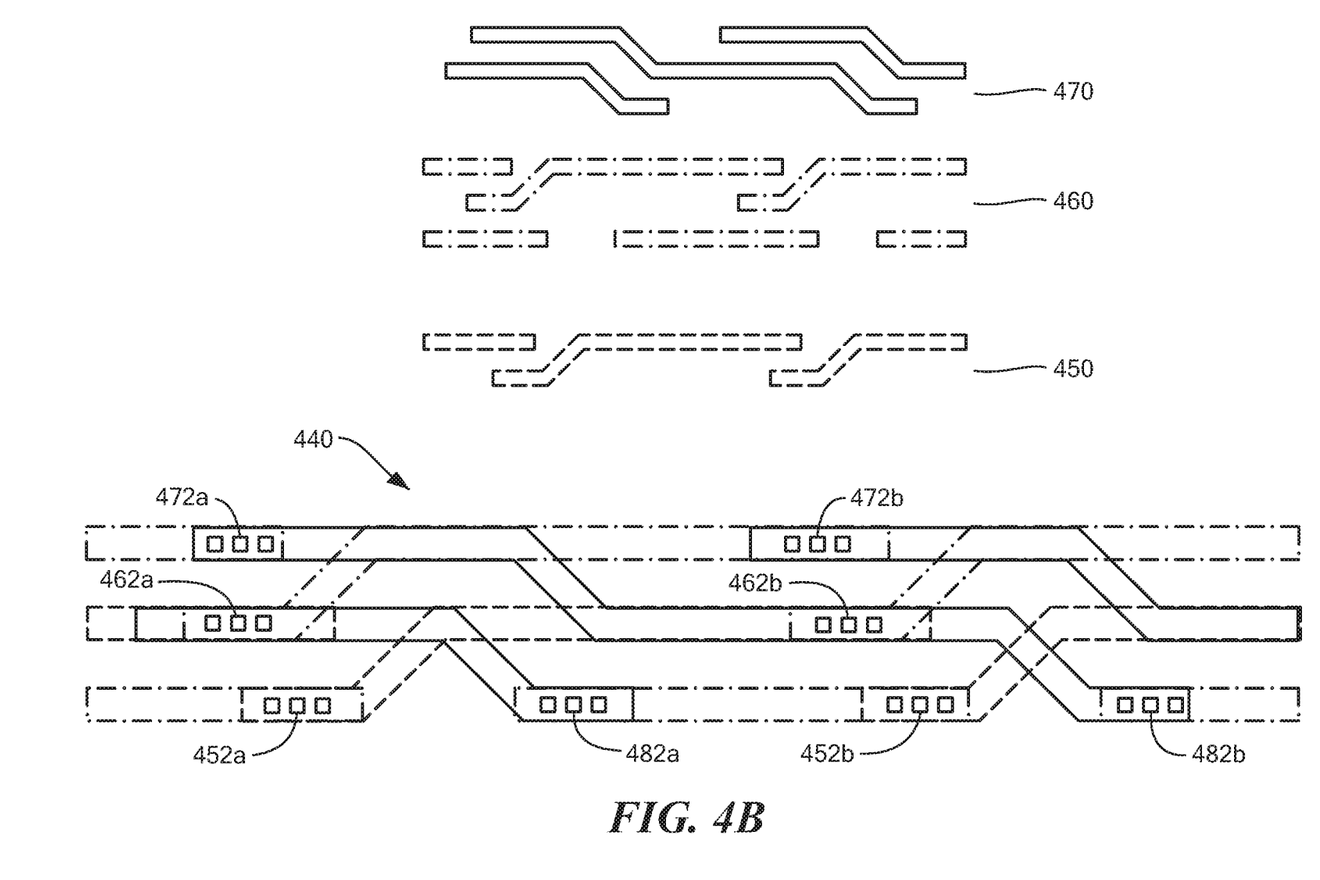
FIG. 4B is an exploded view of a substrate having two or more portions each with an arrangement of signals, according to some embodiments.

Referring also to FIG. 4B, a top plan view of an alternative configuration 440 by which signal traces of adjacent substrate portions (e.g., substrate portions 118, 120) are interconnected in a manner that achieves rotation of signal traces from one substrate portion to the next is shown. Traces of a first metal layer (e.g., metal layer m1 104 of FIG. 1) are illustrated by dotted lines and labelled 470, traces of a second metal layer (e.g., metal layer m1 108 of FIG. 1) are illustrated by dash/dot lines and labelled 460 and traces of a third metal layer (e.g., metal layer m1 112 of FIG. 1) are illustrated by solid lines and labeled 450. As can be seen from the composite view 440 in which traces 450 460, 470 are overlaid, third metal layer traces 450 overlap with second metal layer traces 460 at interconnects (e.g., at one or more conductive vias) 452a, 452b and 462a, 462b, which interconnects are configured to couple the third metal layer traces 450 to the second metal layer traces 460. Note that although first metal layer traces 470 are vertically aligned with the second and third metal layer traces in the locations of interconnects 462a, 462b, such interconnects do not extend as far as the first metal layer traces 470. Further, first metal layer traces 470 overlap with second metal layer traces 460 at interconnects (e.g., at one more conductive vias) 472a, 472b and 482a, 482b, which interconnects are configured to couple the first metal layer traces 470 to the second metal layer traces 460. As will be appreciated by consideration of FIGS. 4A and 4B for example, the signal traces of each metal layer can be routed in various configurations to result in a substantially vertical overlap of traces of the different metal layers sought to be interconnected by one or more conductive vias.

Figure 5:
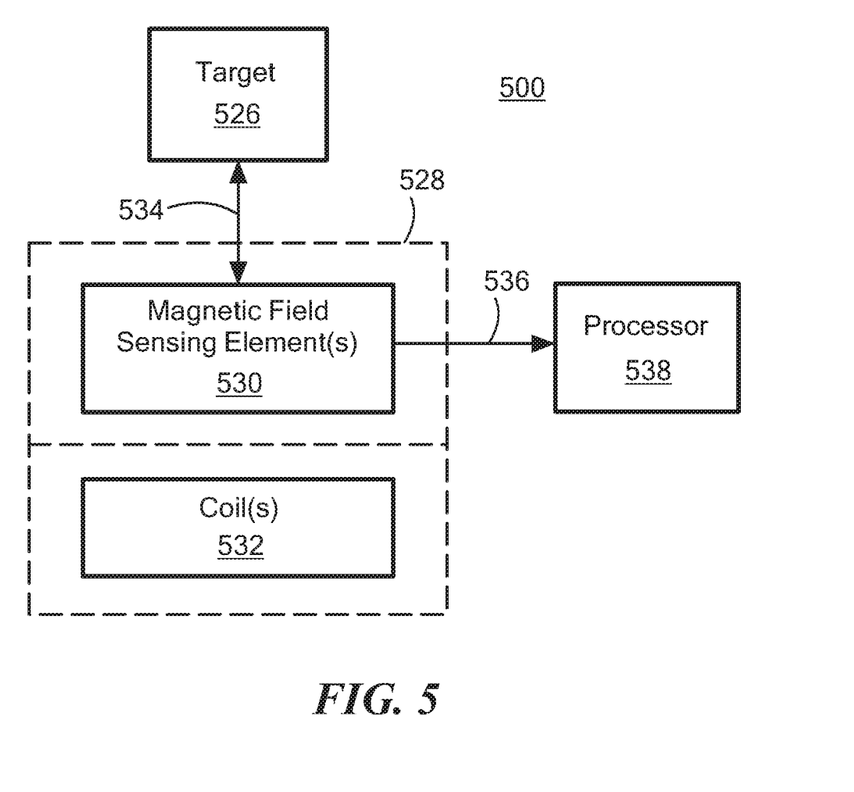
FIG. 5 is a block diagram of an example system including a substrate, according to some embodiments.

FIG. 5 illustrates an example application for substrate 100 having a plurality of portions along a length of the substrate in which signal traces are rotated relative to adjacent portions according to the disclosure. System 500 includes a magnetic field sensor IC 528, a target 526, and a processor 538. The sensor IC 528 may include one or more magnetic field sensing elements 530 and one or more coils 532 (which coils may be internal or external with respect to the IC 528). Magnetic field sensing elements 530 are configured to sense a magnetic field affected by the position and/or movement of target 526. Magnetic field sensing elements 530 may take various forms including, but not limited to one or more Hall effect elements, magnetoresistance (MR) elements, and/or magnetotransistors.

Target 526 may generate and/or alter a magnetic field for detection by sensing elements 530. In an embodiment, target 526 comprises a conductive material that allows for eddy currents to flow within the target. Target 526 may comprise a magnetic object (e.g. a hard-ferromagnetic material) or a ferromagnetic object (e.g. a soft ferromagnetic material) that alters a magnetic field as the position of the target changes relative to the sensor IC 528. Target 526 may take various forms, such as a ring magnet with a plurality of magnetic poles or a gear having a plurality of teeth.

The magnetic field affected by the position and/or movement of target 526 may be generated by coil 532 and/or by another magnetic field source. For example, as described in a co-pending U.S. patent application Ser. No. 15/606,358 entitled "Coil Actuated Position Sensor With Reflected Magnetic Field" filed on May 26, 2017, a coil 532 supported by a substrate can generate a magnetic field that is reflected by a conductive target 526 for detection of target position relative to the sensor IC 528 as the target moves along an axis 534 for example. In other embodiments, a magnetic field may be generated by a magnet (not shown) proximate to sensor IC 528, as may take the form of a back-bias magnet.

Sensing elements 530 detect the magnetic field affected by the target 526 in order to thereby detect target position and/or movement characteristics (e.g., speed, direction of movement, etc.). For example, in the configuration of the above-referenced U.S. patent application Ser. No. 15/606,358, sensing elements 530 are configured to detect the field reflected by the target (i.e., the "reflected magnetic field") in the presence of the field generated by the coil (i.e., the "directly coupled" magnetic field).

Magnetic field signals generated by sensing elements 530 may be coupled to processor 538 over traces 536 of sensor IC 528. These traces 536 include arrangements of signals that are rotated, or twisted, relative to one another as discussed above with reference to FIGS. 1-4B. By twisting the arrangement of signals carried by traces 536, immunity of the signals indicative of a magnetic field intended to be detected (e.g., the reflected magnetic field) to other the magnetic fields (e.g., the directly coupled field generated by coil 532) is improved, as compared to non-twisted signal traces. Because of the relatively high frequency reflected magnetic field to be detected in the presence of the directly coupled field from the coil 532, a system 500 of this type can experience significant benefits in terms of signal trace immunity to magnetic field induction. It will be appreciated however, that system 500 is but one of a multitude of systems that would benefit from the signal routing configurations and techniques of the disclosure.

Processor 538 may perform various operations on the magnetic field signals carried by traces 536, to determine the position of target 526, which may include operations to filter, compare, convert (such as an analog to digital conversion), amplify, etc. the signals. An output may be provided by the processor representative of the position and/or movement of target 526. It will be appreciated that processor 538 may take various forms including analog and/or digital circuitry, computer programs, logic circuitry (e.g., an FPGA (field programmable gate array) and/or an ASIC (application-specific integrated circuit)).

Having described exemplary embodiments, it will now become apparent to one of ordinary skill in the art that other embodiments incorporating their concepts may also be used. The embodiments contained herein should not be limited to disclosed embodiments but rather should be limited only by the spirit and scope of the appended claims. All publications and references cited herein are expressly incorporated herein by reference in their entirety.

Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

What is claimed is:

1. A substrate for an integrated circuit, the substrate comprising:
   a first metal layer having first and second spaced portions, wherein the first portion comprises a first trace configured to carry a first signal and wherein the second portion comprises a second trace configured to carry a second signal;
   a second metal layer disposed above the first metal layer, the second metal layer having first and second spaced portions, wherein the first portion of the second metal layer comprises third and fourth spaced traces configured to carry the second signal and wherein the second portion comprises fifth and sixth spaced traces configured to carry the first signal, wherein the first portion of the second metal layer is vertically aligned with the first portion of the first metal layer and the second portion of the second metal layer is vertically aligned with the second portion of the first metal layer; and
   a third metal layer disposed above the second metal layer, the third metal layer having first and second spaced portions, wherein the first portion of the third metal layer comprises a seventh trace configured to carry the first signal and wherein the second portion comprises an eighth trace configured to carry the second signal, wherein the first portion of the third metal layer is vertically aligned with the first portion of the second metal layer and the second portion of the third metal layer is vertically aligned with the second portion of the second metal layer.

2. The substrate of claim 1, wherein each of the first trace, the third trace, the fourth trace, and the seventh trace is spaced from a central longitudinal axis of the substrate.

3. The substrate of claim 2, wherein each of the first trace, the third trace, the fourth trace, and the seventh trace is spaced from the central longitudinal axis of the substrate by the same distance.

4. The substrate of claim 1, wherein the first portion of the first metal layer further comprises at least a portion of the second trace; wherein the first portion of the second metal layer further comprises a connecting trace coupled to the fifth and sixth traces; and wherein the first portion of the third metal layer further comprises at least a portion of the eighth trace.

5. The substrate of claim 1, further comprising a first interconnect configured to couple the fifth and sixth traces to at least one of the first or seventh traces, a second interconnect configured to couple the second trace to at least one of the third or fourth traces, and a third interconnect configured to couple the eighth trace to at least one of the third or fourth traces.

6. The substrate of claim 5, wherein each of the first, second, and third interconnects comprises at least one conductive via.

7. The substrate of claim 1, further comprising a first interlayer disposed between the first metal layer and the second metal layer and a second interlayer disposed between the second metal layer and the third metal layer.

8. The substrate of claim 7, wherein each of the first and second interlayers has a thickness of approximately 7700 Angstrom.

9. The substrate of claim 1, wherein a gap between the first and second portions of the first metal layer is vertically aligned with a gap between the first and second portions of the second metal layer and a gap between the first and second spaced portions of the third metal layer.

10. The substrate of claim 1, wherein the first metal layer further has a third portion spaced from the second portion, wherein the third portion comprises a ninth trace configured to carry the second signal; wherein the second metal layer further has a third portion spaced from the second portion, wherein the third portion comprises tenth and eleventh traces configured to carry the first signal; and wherein the third metal layer further has a third portion spaced from the second portion, wherein the third portion comprises a twelfth trace configured to carry the second signal.

11. The substrate of claim 1, wherein the first signal is generated by a first magnetic field sensing element and the second signal is generated by a second magnetic field sensing element.

12. A substrate for an integrated circuit having at least three metal layers disposed parallel to one another, comprising:
    a first arrangement of signals, comprising:
       a first signal provided to a first trace of a first metal layer and a second trace of a third metal layer disposed above the first metal layer, wherein the second trace of the third metal layer is vertically aligned with the first trace of the first metal layer; and
       a second signal provided to third and fourth traces of a second metal layer disposed between the first and third metal layers; and
    a second arrangement of signals rotated with respect to the first arrangement, wherein the second arrangement comprises:
       the second signal provided to a fifth trace of the first metal layer and a sixth trace of the third metal layer, wherein the sixth trace of the third metal layer is vertically aligned with the fifth trace of the first metal layer; and
       the first signal provided to seventh and eighth traces of the second metal layer.

13. The substrate of claim 12, wherein each of the first trace, the second trace, the third trace, and the fourth trace is spaced from a central longitudinal axis of the substrate.

14. The substrate of claim 13, wherein each of first trace, the second trace, the third trace, and the fourth trace is spaced from the central longitudinal axis of the substrate by the same distance.

15. The substrate of claim 12, further comprising a third arrangement of signals rotated with respect to the second arrangement, wherein the third arrangement comprises:
    the first signal provided to a ninth trace of the first metal layer and a tenth trace of the third metal layer; and
    the second signal provided to eleventh and twelfth traces of the second metal layer.

16. The substrate of claim 12, further comprising a first interconnect configured to couple the first trace to the seventh trace, a second interconnect configured to couple the second trace to the eighth trace, a third interconnect configured to couple the third trace to the sixth trace, and a fourth interconnect configured to couple the fourth trace to the fifth trace.

17. The substrate of claim 16, wherein each of the first, second, third, and fourth interconnects comprises at least one conductive via.

18. The substrate of claim 12, wherein the first signal is generated by a first magnetic field sensing element and the second signal is generated by a second magnetic field sensing element.

19. A substrate for an integrated circuit, the substrate comprising:
- means for providing a first signal to a first trace extending along a first length of a first metal layer and to a second trace extending along a first length of a third metal layer disposed above the first metal layer;
- means for providing a second signal to third and fourth traces extending along a first length of a second metal layer disposed between the first and third metal layers, wherein the first length of the second metal layer is vertically aligned with the first length of the first and third metal layers;
- means for coupling the first trace and the second trace to fifth and sixth traces extending along a second length of the second metal layer;
- means for coupling the third trace to a seventh trace extending along a second length of the third metal layer; and
- means for coupling the fourth trace to an eighth trace extending along a second length of the first metal layer, wherein the second length of the first metal layer, the second length of the second metal layer and the second length of the third metal layer are vertically aligned with each other.

* * * * *

UNITED STATES PATENT AND TRADEMARK OFFICE
CERTIFICATE OF CORRECTION

PATENT NO. : 10,763,219 B2  
APPLICATION NO. : 16/102984  
DATED : September 1, 2020  
INVENTOR(S) : Cristian David Almiron et al.

Page 1 of 1

It is certified that error appears in the above-identified patent and that said Letters Patent is hereby corrected as shown below:

In the Specification

Column 1, Line 51 delete "portion" and replace with --portions--.

Column 3, Line 7 delete "trance" and replace with --trace--.

Column 3, Line 46 delete "trance" and replace with --trace--.

Column 7, Line 30 delete "at at least" and replace with --at least--.

Column 7, Line 40 delete "substrate an" and replace with --substrate at an--.

Column 7, Line 63 delete "are the substantially" and replace with --are substantially--.

Column 9, Line 67 delete "arrangement signals" and replace with --arrangement of signals--.

Column 11, Line 14 delete ". And a" and replace with --. A--.

Column 12, Line 34 delete "to other the" and replace with --over the--.

Signed and Sealed this  
Sixteenth Day of March, 2021

Drew Hirshfeld  
*Performing the Functions and Duties of the*  
*Under Secretary of Commerce for Intellectual Property and*  
*Director of the United States Patent and Trademark Office*